(12) United States Patent  
Hillman et al.

(10) Patent No.: US 12,532,704 B2  
(45) Date of Patent: Jan. 20, 2026

(54) WAFER DETECTION SYSTEM (71) Applicant: Service Support Specialties, Inc., Montville, NJ (US)

(72) Inventors: Gary Hillman, Livingston, NJ (US); Rodrigo Nogueira, New York, NY (US)

(73) Assignee: Service Support Specialties, Inc.

( * ) Notice: Subject to any disclaimer, the term of this patent is extended or adjusted under 35 U.S.C. 154(b) by 0 days.

(21) Appl. No.: 19/237,082

(22) Filed: Jun. 13, 2025

(65) Prior Publication Data

US 2025/0391689 A1    Dec. 25, 2025

Related U.S. Application Data

(60) Provisional application No. 63/662,589, filed on Jun. 21, 2024.

(51) Int. Cl.
| | |
|---|---|
| *B25J 15/06* | (2006.01) |
| *H01L 21/68* | (2006.01) |
| *H01L 21/683* | (2006.01) |
| *H01L 21/687* | (2006.01) |

(52) U.S. Cl.  
CPC .......... *H01L 21/68* (2013.01); *H01L 21/6838* (2013.01); *H01L 21/68707* (2013.01)

(58) Field of Classification Search  
CPC ................. H01L 21/68; H01L 21/6838; H01L 21/68707  
USPC ........................................................ 294/183  
See application file for complete search history.

(56) References Cited

U.S. PATENT DOCUMENTS

| | | | | |
|---|---|---|---|---|
| 6,027,605 | A  * | 2/2000  | Lehmann | ............. B23Q 17/002 |
| | | | | 118/712 |
| 6,090,220 | A  * | 7/2000  | Kim | ................... H01L 21/67017 |
| | | | | 134/32 |
| 6,322,116 | B1 * | 11/2001 | Stevens | ............... H01L 21/6838 |
| | | | | 414/941 |
| 10,553,472 | B2 * | 2/2020  | Bosboom | ................ H01L 21/68 |
| 11,935,778 | B2 * | 3/2024  | Kakinuma | ........... B25J 15/0616 |
| 2003/0052495 | A1 * | 3/2003  | Casarotti | ........... H01L 21/67259 |
| | | | | 414/941 |
| 2021/0050244 | A1 * | 2/2021  | Kakinuma | ........ H01L 21/68707 |
| 2025/0140591 | A1 * | 5/2025  | Kodama | ........... H01L 21/67742 |

* cited by examiner

*Primary Examiner* — Paul T Chin  
(74) *Attorney, Agent, or Firm* — The Belles Group, P.C.

(57) ABSTRACT

A system for detecting the presence of a wafer on a wafer handling robot. The system includes a robot having an end effector with a ledge portion having an opening; a vacuum pump; a conduit fluidly coupling the vacuum pump to the opening in the ledge portion; a pressure sensor located along the conduit to determine whether a measured pressure is within a target pressure range; and a wafer configured to be supported by the at least one end effector and spaced apart from the ledge portion by an air gap. When the wafer is supported by the at least one end effector in a proper position, the measured pressure is within the target pressure range. When the wafer is not supported by the wafer support structure or is supported by the wafer support structure in an improper position, the measured pressure is outside of the target pressure range.

20 Claims, 9 Drawing Sheets

WAFER DETECTION SYSTEM

CROSS-REFERENCE TO RELATED APPLICATIONS

The present application claims priority to U.S. Provisional Patent Application Ser. No. 63/662,589, filed Jun. 21, 2024, the entirety of which is incorporated herein by reference.

BACKGROUND

As the use of semiconductor processing and semiconductor like processing has become more ubiquitous in industrial undertakings of various and sundry kinds, it has become desirable, if not necessary, to process wafer-like substrates on both sides of the wafer. This has necessitated means by which the wafer can be processed and handled without touching either of the planar surfaces which constitute the front and rear surfaces of the wafers.

In some use cases, is may be preferable that the robotic end effectors used to move the wafers from place to place during processing do not contact either of the planar surfaces (i.e., the front and rear surfaces) of the wafer. This can be problematic when handling wafers because it is frequently necessary and always desirable to confirm the presence of a wafer on the robotic end effector. Previously, confirmation of the presence of a wafer on the robotic end effector has been achieved using reflective (if the wafer is transparent and/or specular) or through-beam (if the wafer is opaque) sensors. However, the use of such sensors can be complicated and costly, especially in situations that stack the wafers on robots with multiple end effectors. The stacking makes using such optical detection means more difficult because the wafers are so often blocking the "view" of the optical detector so as to render unsure which wafer of the two present is being detected. Thus, a need exists for an improved apparatus and/or system for the detection and confirmation of positioning of a wafer on a robot end effector.

SUMMARY

A system for detecting the presence of a wafer on a wafer handling robot. The system includes a robot having an end effector with a ledge portion having an opening; a vacuum pump; a conduit fluidly coupling the vacuum pump to the opening in the ledge portion; a pressure sensor located along the conduit to determine whether a measured pressure is within a target pressure range; and a wafer configured to be supported by the at least one end effector and spaced apart from the ledge portion by an air gap. When the wafer is supported by the at least one end effector in a proper position, the measured pressure is within the target pressure range. When the wafer is not supported by the wafer support structure or is supported by the wafer support structure in an improper position, the measured pressure is outside of the target pressure range.

In one aspect, the invention may be a wafer detection system comprising: a robot comprising at least one end effector, the at least one end effector comprising a wafer support structure configured to support a wafer thereon without directly contacting a front surface of the wafer or a rear surface of the wafer, the wafer support structure comprising a ledge portion that is configured to extend below the wafer so that one of the front and rear surfaces of the wafer faces the ledge portion with a gap maintained between a top surface of the ledge portion and the one of the front and rear surfaces of the wafer; a vacuum pump; a conduit fluidly coupling the vacuum pump to the gap so that when activated the vacuum pump pulls air from the gap; a pressure sensor located along the conduit and configured to measure a pressure and to determine whether the measured pressure is within a target pressure range; wherein when the wafer is supported by the wafer support structure in a proper position, the measured pressure is within the target pressure range and the robot is permitted to perform a task; and wherein when the wafer is not supported by the wafer support structure or is supported by the wafer support structure in an improper position, the measured pressure is outside of the target pressure range and at least one of: the robot is prevented from performing the task; or an indicator is activated.

In another aspect, the invention may be a wafer detection system comprising: a robot comprising at least one end effector, the at least one end effector comprising a ledge portion having an opening; a vacuum pump; a conduit fluidly coupling the vacuum pump to the opening in the ledge portion; a pressure sensor located along the conduit and configured to measure a pressure and to determine whether the measured pressure is within a target pressure range; a wafer configured to be supported by the at least one end effector so that a first surface of the wafer faces the ledge portion and is spaced apart from the ledge portion by an air gap, the vacuum pump configured to suction air from the air gap; wherein when the wafer is supported by the at least one end effector in a proper position, the measured pressure is within the target pressure range; and wherein when the wafer is not supported by the at least one end effector or is supported by the at least one end effector in an improper position, the measured pressure is outside of the target pressure range.

In yet another aspect, the invention may be a method of detecting a presence and proper positioning of a wafer on a wafer handling robot, the method comprising: fluidly coupling a vacuum pump to an opening in a ledge portion of the wafer handling robot via a conduit and activating the vacuum pump to suction air through the opening in the ledge portion; measuring a pressure at a position along the conduit with a pressure sensor; upon the measured pressure being within a target pressure range: determining that the wafer is properly positioned on the wafer handling robot such that one of a front surface and a rear surface of the wafer is spaced from the ledge portion by an air gap; and permitting the wafer handling robot to perform a task; and upon the measured pressure being outside of the target pressure range: determining that the wafer is not properly positioned on the wafer handling robot; and at least one of: preventing the wafer handling robot from performing the task; or activating an indicator.

BRIEF DESCRIPTION OF THE DRAWINGS

The present invention will become more fully understood from the detailed description and the accompanying drawings, wherein.

DETAILED DESCRIPTION OF THE INVENTION

The following description of the preferred embodiment(s) is merely exemplary in nature and is in no way intended to limit the invention, its application, or uses.

The description of illustrative embodiments according to principles of the present invention is intended to be read in connection with the accompanying drawings, which are to be considered part of the entire written description. In the description of embodiments of the invention disclosed herein, any reference to direction or orientation is merely intended for convenience of description and is not intended in any way to limit the scope of the present invention. Relative terms such as "lower," "upper," "horizontal," "vertical," "above," "below," "up," "down," "top" and "bottom" as well as derivatives thereof (e.g., "horizontally," "downwardly," "upwardly," etc.) should be construed to refer to the orientation as then described or as shown in the drawing under discussion. These relative terms are for convenience of description only and do not require that the apparatus be constructed or operated in a particular orientation unless explicitly indicated as such. Terms such as "attached," "affixed," "connected," "coupled," "interconnected," and similar refer to a relationship wherein structures are secured or attached to one another either directly or indirectly through intervening structures, as well as both movable or rigid attachments or relationships, unless expressly described otherwise. Moreover, the features and benefits of the invention are illustrated by reference to the exemplified embodiments. Accordingly, the invention expressly should not be limited to such exemplary embodiments illustrating some possible non-limiting combination of features that may exist alone or in other combinations of features; the scope of the invention being defined by the claims appended hereto.

Figure 1:
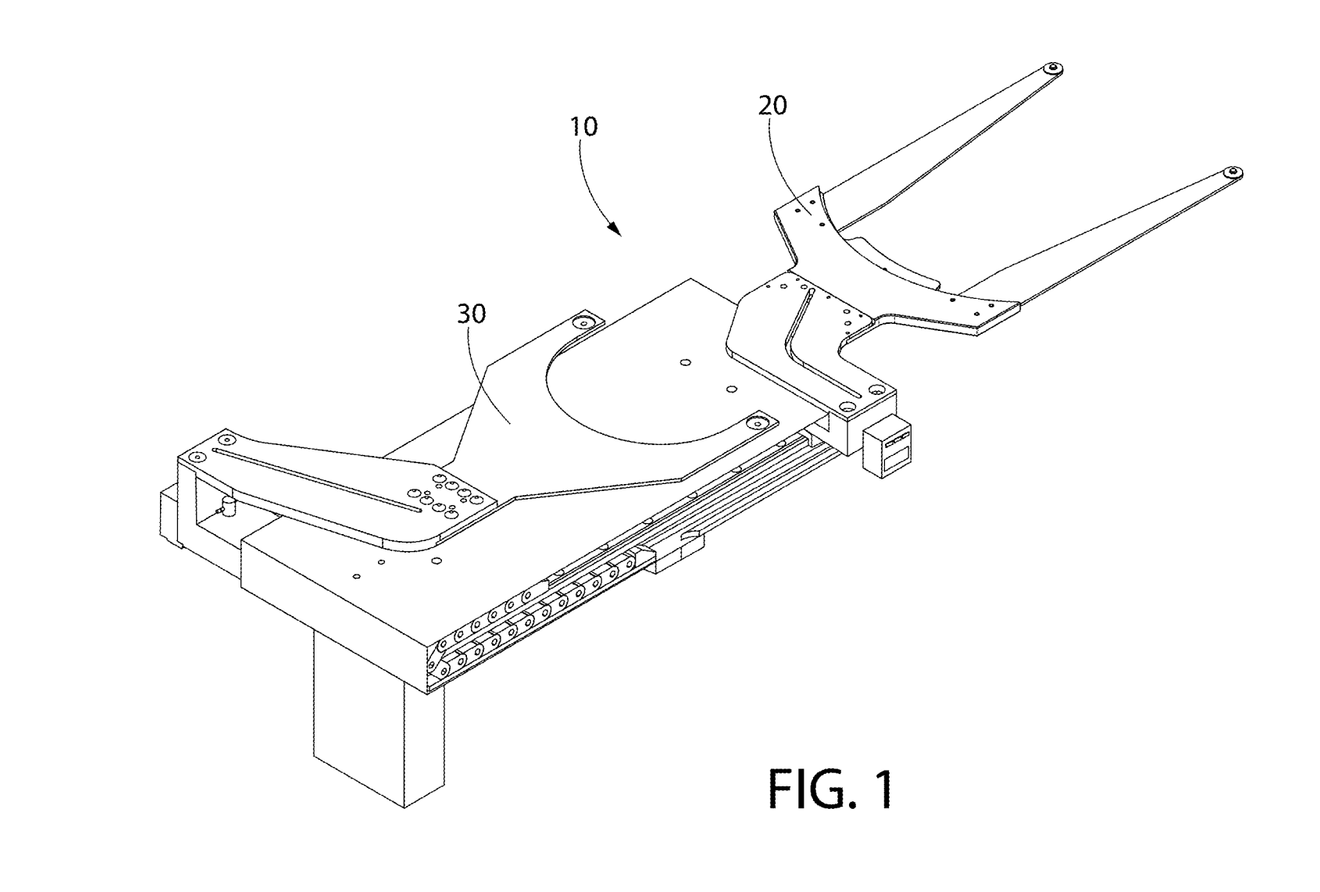
FIG. 1 is a perspective view of a robot with one or more end effectors in accordance with an embodiment of the present invention.

Referring to FIGS. 1, a wafer handling robot 10 is illustrated in accordance with an embodiment of the present invention. The robot 10 may comprise one or more end effectors 20, 30 each of which may be configured to support and move a wafer between processing stations in a wafer processing facility. For purposes of this invention, it is to be understood that the term wafer may include, without limitation, any solid substance onto which a layer of another substance is applied and that is used in, for example, the solar or semiconductor industries. This includes, without limitation, silicon wafers, glass substrates, fiber optic substrates, fused quartz, fused silica, epitaxial silicon, raw wafers, solar cells, medical devices, disks and heads, flat panel displays, microelectronic masks, and other applications that may require undergoing the processes described herein. The terms substrate and wafer may be used interchangeably throughout the description herein. Furthermore, it should be understood that the invention is not limited to any particular type of substrate and the systems, methods, and apparatuses described herein may be used with any flat article. Typically, the wafer may be a flat article used in the fabrication of an integrated circuit, although the invention is not to be so limited in all embodiments. In some embodiments, wafers may be formed from a thin slice of a semiconductor material, such as a crystalline silicon.

The robot 10 may be configured for movement in various directions, including vertically up and down along an X-axis and horizontally along a Y-axis. Each of the end effectors 20, 30 may be configured for movement horizontally along the Y-axis. Each of the end effectors 20, 30 may also be configured for rotational movement. The various movements of the robot 10 and its end effectors 20, 30 may permit the end effectors 20, 30 to move wafers throughout a wafer processing facility. This includes moving wafers between cassettes, buffers, processing stations and the like. In some embodiments, the end effectors 20, 30 may be capable of handling/holding the wafers without directly contacting either of the front or rear (i.e., top or bottom) surfaces of the wafer. Rather, the end effectors 20 may only contact the wafer on its top or bottom edge, which is the edge between the top surface and the periphery of the wafer or the edge between the bottom surface and the periphery of the wafer.

Figure 2:
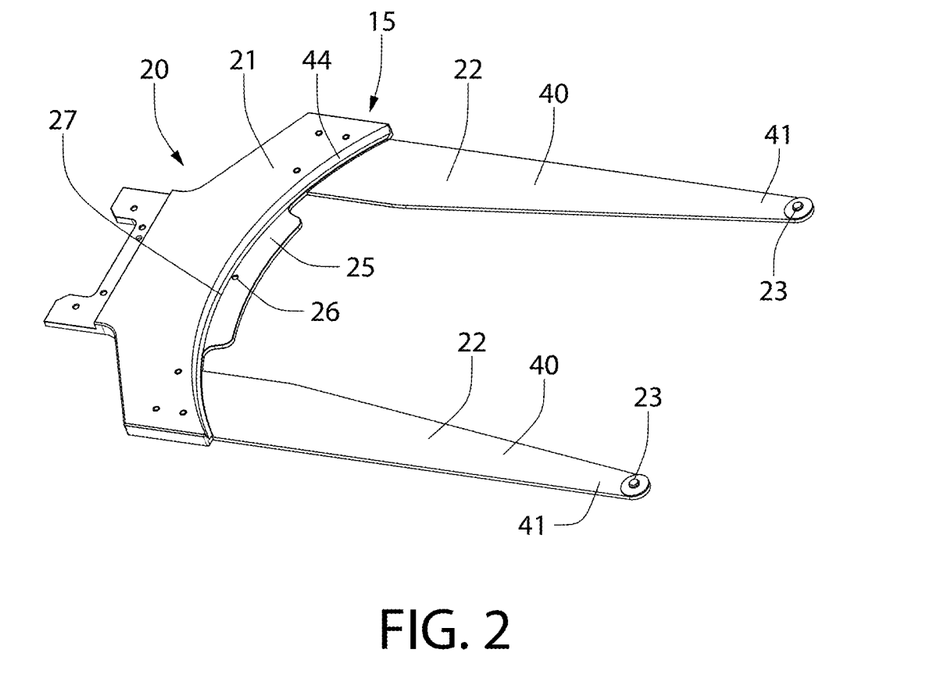
FIG. 2 is a top perspective view of an end effector of the robot of FIG. 1.
Figure 3:
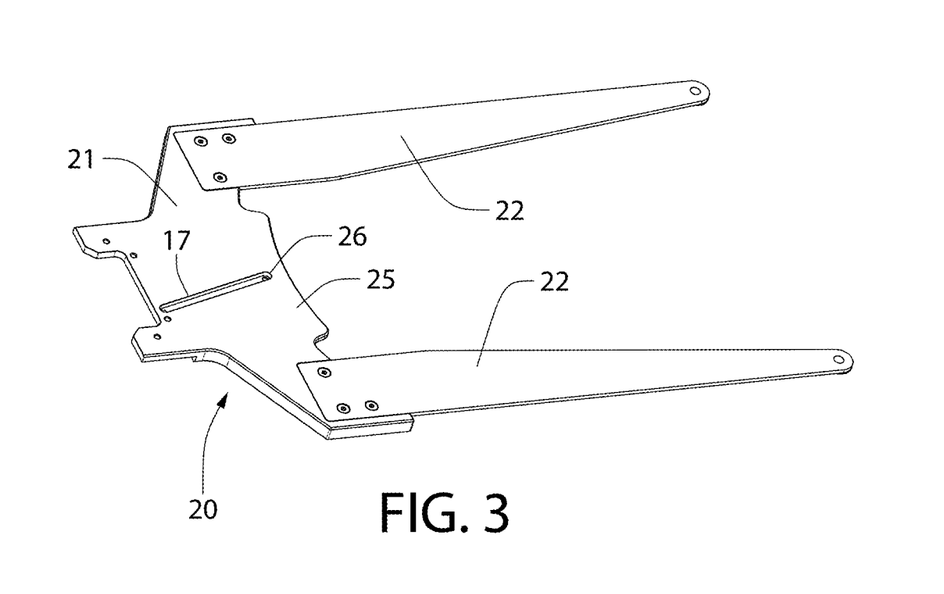
FIG. 3 is a bottom perspective view of the end effector of FIG. 2.
Figure 4:
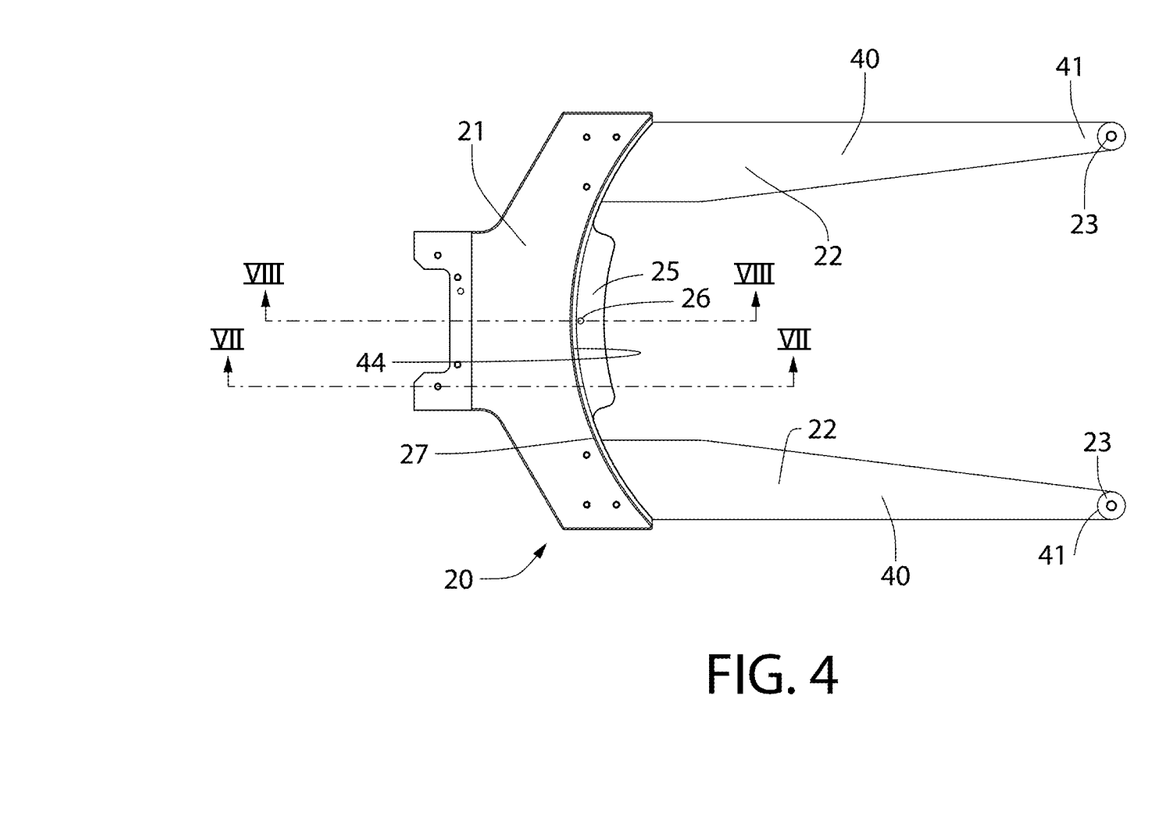
FIG. 4 is a top plan view of the end effector of FIG. 2.

Referring to FIGS. 2-4, an embodiment of one of the end effectors 20 is illustrated. The embodiment shown in FIGS. 2-4 may be used for one or both of the end effectors 20, 30 of the robot 10. The end effector 20 may comprise a wafer support structure 15 that is configured to support a wafer thereon. The wafer support structure 15 may be configured to support the wafer without contacting the front and rear surfaces of the wafer as noted. The wafer support structure 15 may comprise a main body portion (also referred to as a wrist portion) 21, a sloped wall portion 27, a ledge portion 25, and a pair of paddles 22. Each of the paddles of the pair of paddles 22 may comprise a paddle body portion 40 having a distal end portion 41 and a support pin 23 located on the distal end portion 41 of the paddle 22. A wafer may be supported by the wafer support structure 15 of the end effector 20 by the sloped wall portion 27 and an angled wall of the support pins 23 without directly contacting the top and bottom surfaces of the wafer, as described herein.

The main body portion 21 may comprise an inner surface 44. In an embodiment, the sloped wall portion 27 may extend from the inner surface 44 of the main body portion 21. Furthermore, the ledge portion 25 and the paddles 22 may extend from a terminal (or distal) end of the sloped wall portion 27. The sloped wall portion 27 may extend continuously along the entire inner surface 44 of the main body portion 21. Alternatively, the sloped wall portion 27 may extend along only a part of the inner surface 44 of the main body portion 21, or the sloped wall portion 27 may be formed in sections such that the sloped wall portion 27 extends intermittently from the inner surface 44 of the main body portion 21 with gaps or spaces between the sections. In the exemplified embodiment, the ledge portion 25 and the paddles 22 extend from the terminal or distal end of the sloped wall portion 27. Alternatively, the ledge portion 25 and/or the paddles 22 may extend directly from the inner surface 44 of the main body portion 21 in embodiments where the sloped wall portion 27 does not extend continuously along the entirety of the inner surface 44.

The ledge portion 25 may extend from the main body portion 21 (or, more specifically, from the sloped wall portion 27) in the same direction as the paddles 22. The ledge portion 25 may be located between the pair of paddles 22. In the exemplified embodiment, the ledge portion 25 extends most of the distance between the paddles 22. In other embodiments, the length of the ledge portion 25 as measured between the paddles 22 may be reduced from that which is shown in the drawings, or the ledge portion 25 may be extended to be attached to the paddles 22. The ledge portion 25 may comprise a hole or opening 26. The hole 26 may be operably coupled to a vacuum pump, as described in more detail below. The end effector 20 may have a passageway 17 that terminates in the opening 26 and which facilitates the coupling of the vacuum pump to the opening 26. The ledge portion 25 may be referred to as a vacuum pad in some embodiments due to the operable coupling of the vacuum pump to the opening 26 in the ledge portion 25. This is because one function of the ledge portion 25 is to extend below the wafer when the wafer is supported by the wafer support structure 15 to suction air from a space between the wafer and the ledge portion 25 to determine whether the wafer is present or absent, and if present whether the wafer is properly positioned on the wafer support structure 15.

Figure 5:
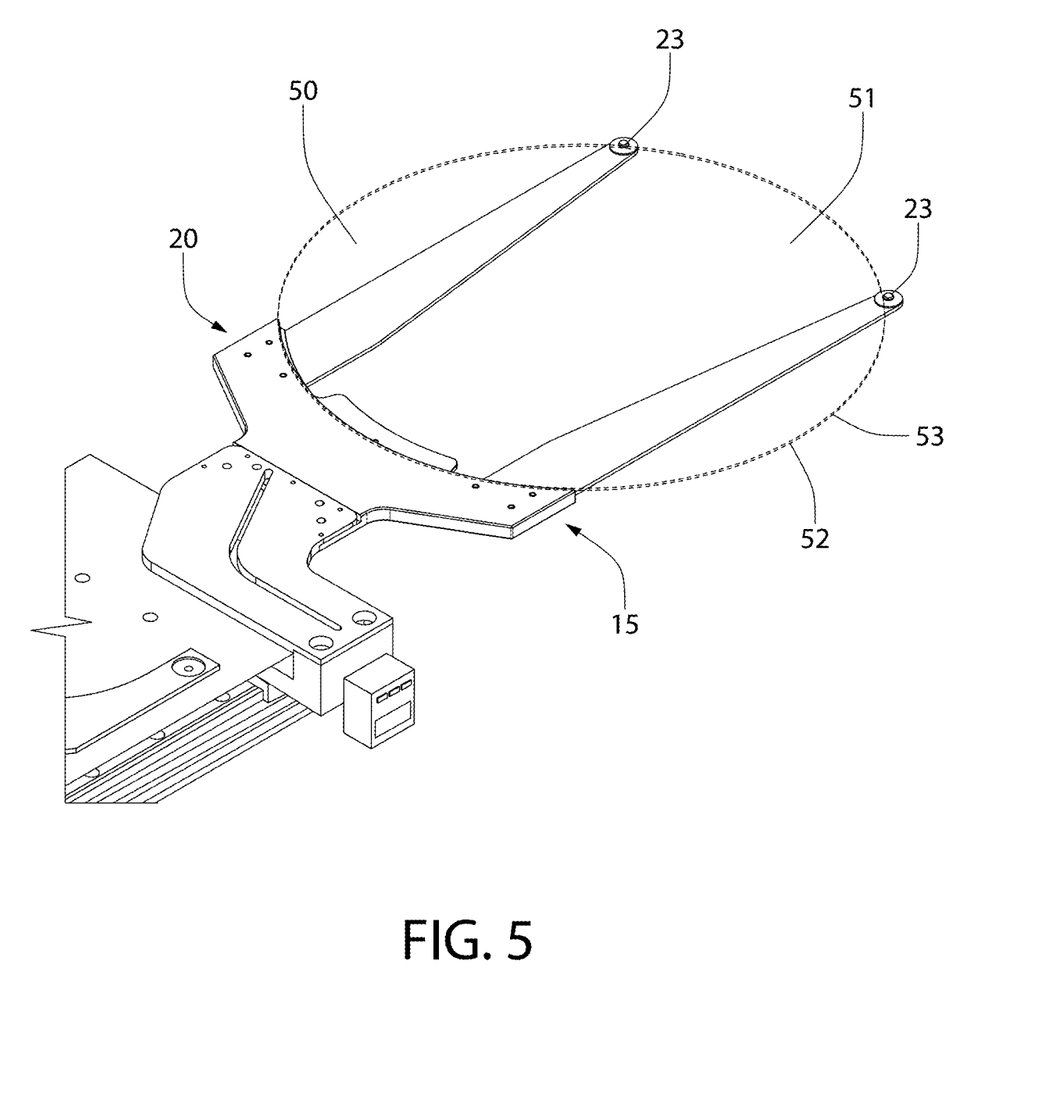
FIG. 5 is a partial perspective view of the robot of FIG. 1 illustrating the end effector supporting a wafer.
Figure 6:
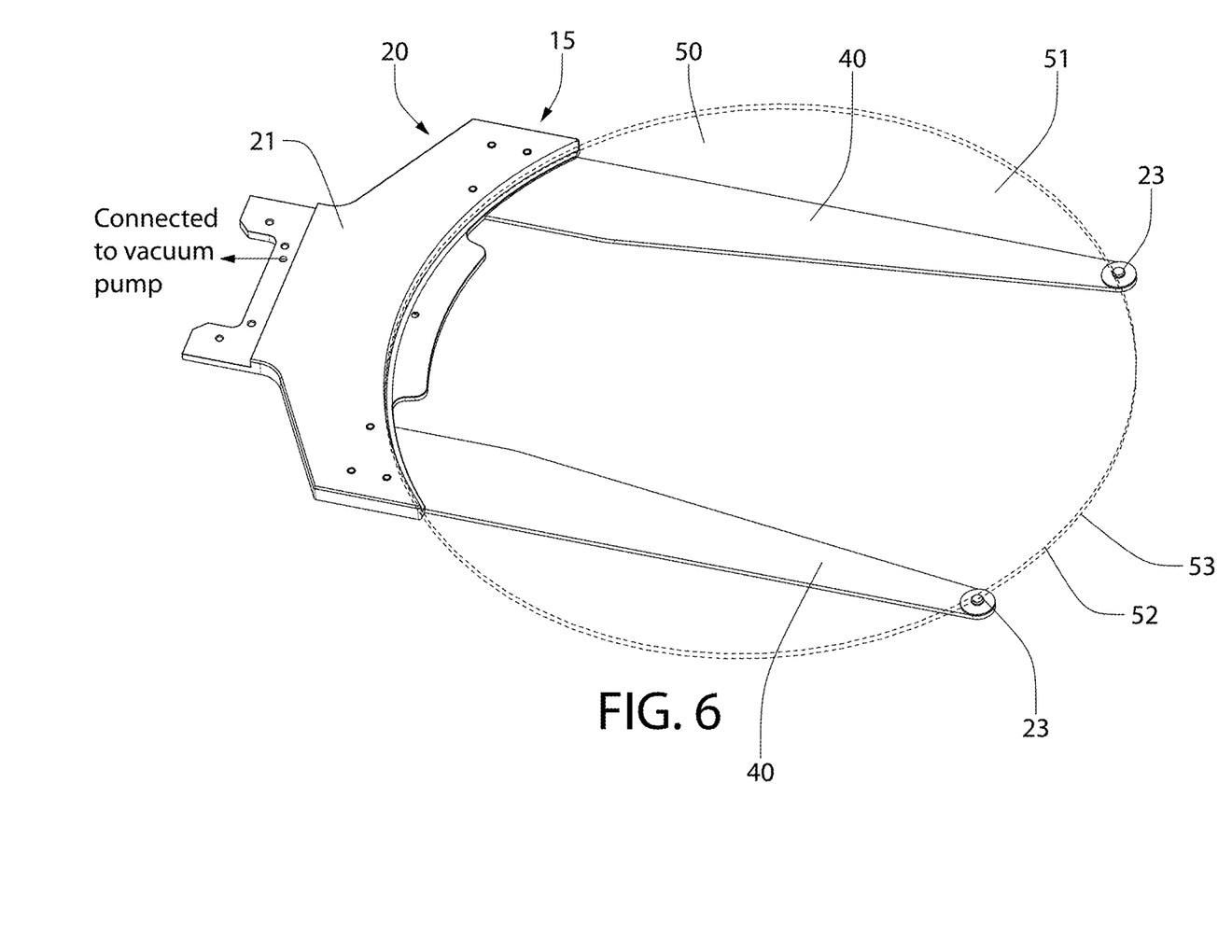
FIG. 6 is a perspective view of the end effector of FIG. 2 supporting a wafer.
Figure 7:
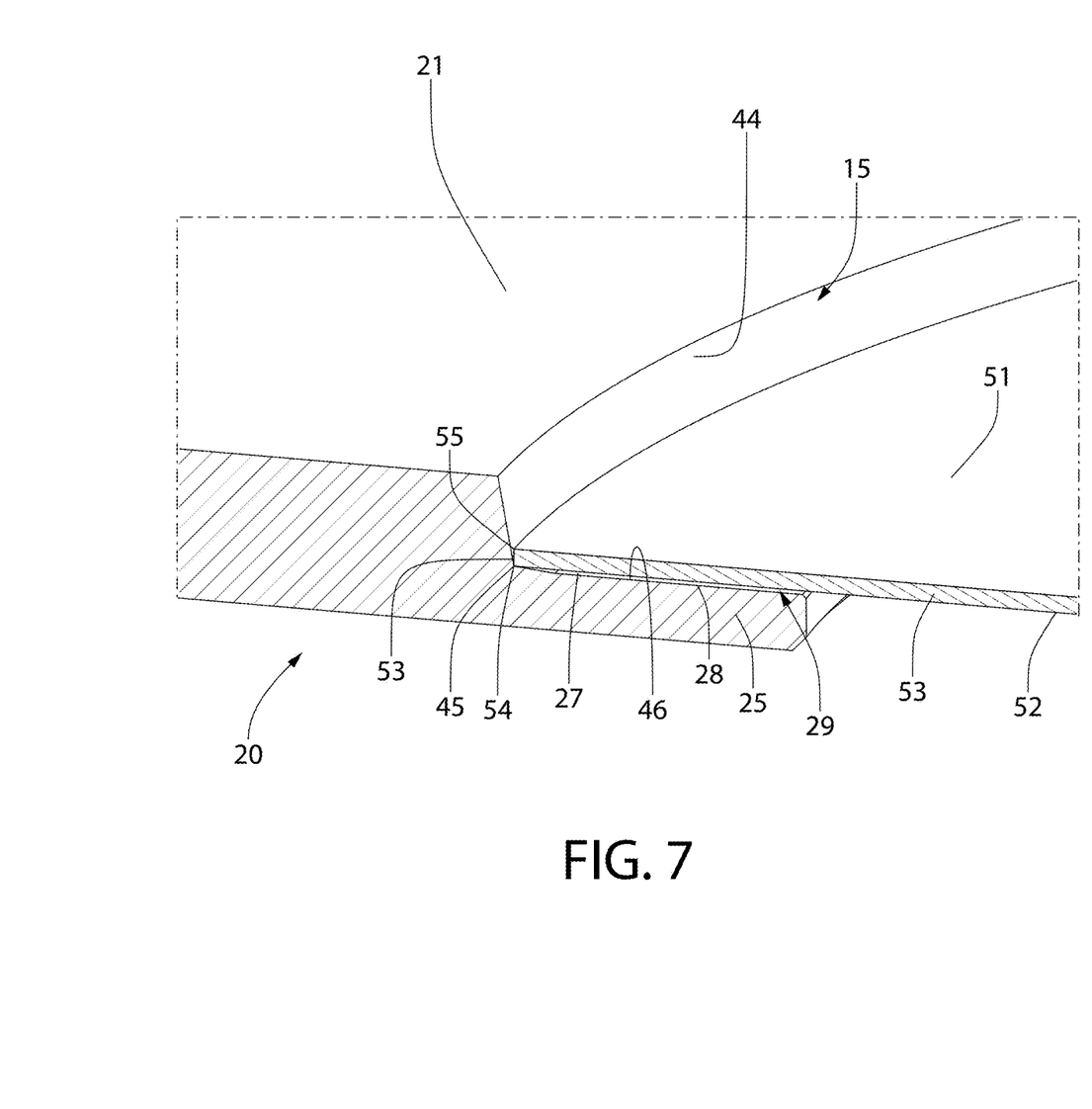
FIG. 7 is a cross-sectional view taken along line VII-VII of FIG. 4.

Referring to FIGS. 5-7, the end effector 20 is illustrated supporting a wafer 50. The wafer 50 may comprise a front surface (i.e., a top surface) 51, a back surface 52 (i.e., a bottom surface), and a peripheral surface 53. The front and back surfaces 51, 52 may be the major surfaces of the wafer 50 and they may be planar. It may be preferable or necessary to ensure that the end effector 20 does not contact the front and back surfaces 51, 52 of the wafer 50 during handling. The peripheral surface 53 of the wafer 50 may extend between the front and back surfaces 51, 52. The wafer 50 may comprise a bottom outer edge 54 at the intersection of the back surface 52 and the peripheral surface 53 and a top outer edge 55 at the intersection of the front surface 51 and the peripheral surface 53.

As noted above, the end effector 20 may be configured to support the wafer 50 without contacting either of the front surface (i.e., the top surface) 51 or the back/rear surface (i.e., the bottom surface) 52 of the wafer 50. Instead, the end effector 20 may contact only the bottom outer edge 54 of the wafer 50. In other embodiments, the end effector 20 may contact only the top outer edge 55 of the wafer 50. In either case, the front and back surfaces 51, 52 of the wafer 50 may be spaced from the handling surfaces of the end effector 20 so they are not in direct contact with the end effector 20. While not shown as clearly, it should be noted that the support pins 23 are also designed and configured to only contact the bottom or top outer edges 54, 55 of the wafer 50 and to not contact any part of the front and rear surfaces 51, 52 of the wafer 50. While the description herein indicates that there is "no contact" with the front and rear surfaces 51, 52 of the wafer 50, it should be noted that a de minimis percentage of the front or rear surface 51, 52 of the wafer 50 may be contacted by the wafer support structure 15, and this could still be considered a "no contact" situation. For example, in FIG. 7 it is possible that an outermost annular portion of the bottom surface 52 of the wafer 50 may be in contact with the sloped wall portion 27, but it is de minimis (the contact exists no more than 2 mm inward from the peripheral surface 53).

To achieve the "no contact" situation as described, in the exemplified embodiment the sloped wall portion 27 extends from the inner surface 44 of the main body portion 21. The sloped wall portion 27 is angled downwardly as it extends further from the inner surface 44 of the main body portion 21. The sloped wall portion 27 intersects the inner surface 44 of the main body portion 21 at a support corner 45. When the wafer 50 is supported by the wafer support structure 15, one of the top and bottom outer edges 54, 55 of the wafer 50 rests in contact with the support corner 45 of the wafer support structure 15. Because the sloped wall portion 27 extends downwardly from the support corner 45, the sloped wall portion 27 does not contact the top or bottom surface 51, 52 of the wafer 50 that faces downwardly towards the sloped wall portion 27.

Furthermore, the inner surface 44 of the main body portion 21 may be angled outwardly as it extends from the sloped wall portion 27. Thus, the inner surface 44 of the main body portion 21 may be angled relative to a vertical axis or plane. As such, when the bottom or top outer edge 54, 55 of the wafer 50 is supported by the support corner 45 of the wafer support structure 15, the inner surface 44 of the main body portion 21 is angled away from the peripheral surface 53 of the wafer 50. This minimizes or prevents contact between the inner surface 44 of the main body portion 21 and the peripheral surface 53 of the wafer 50.

In an embodiment, a top surface of the ledge portion 25 is planar and horizontally oriented. As noted above, the wafer may be positioned so that its bottom outer edge 54 is located at the intersection of the inner surface 44 of the main body portion 21 and the sloped wall portion 27 (i.e., at the support corner 45). Due to the downwardly sloping orientation of the sloped wall portion 27 and the horizontal orientation of the ledge portion 25, a top surface 46 of the ledge portion 25 does not contact the bottom surface 52 of the wafer 50. Rather, a gap 29 exists between the top surface 46 of the ledge portion 25 and the bottom surface 52 of the wafer 50. The gap 29 may be an air gap, in that it is a space between the bottom surface 52 of the wafer 50 and the top surface 46 of the ledge portion 25 that contains nothing but air.

The far end of the wafer 50 located furthest from the main body portion 21 of the end effector 20 may be supported by the support pins 23 without the support pins 23 contacting the bottom surface 52 of the wafer 50. That is, the support pins 23 may be configured to only contact the bottom outer edge 54 of the wafer 50 much like the support corner 45 does. The bottom surface 52 of the wafer 50 does not contact the paddle body portions 40, but instead a gap exists therebetween.

In an embodiment, the top surface 46 of the ledge portion 25 is planar and the surface of the wafer 50 that faces the ledge portion 25 is also planar (i.e., the bottom surface 52 in the embodiment as shown, but it could be the top surface 51 in another embodiment). As such, a height of the gap 29 between the ledge portion 25 and the downwardly facing surface of the wafer 50 is constant. The hole or opening 26 is located in the top surface 46 of the ledge portion 25, to allow air to be pulled or suctioned from the gap 29 to help determine whether the wafer 50 is present or absent. The hole or opening 26 in the top surface 46 of the ledge portion 25 is spaced from the one of the top and bottom surfaces 51, 52 of the wafer 50 that faces the ledge portion 25 by the air gap 29. Thus, the hole or opening 26 is not blocked by the wafer 50 when the wafer is supported by the wafer support structure 15.

Figure 8:
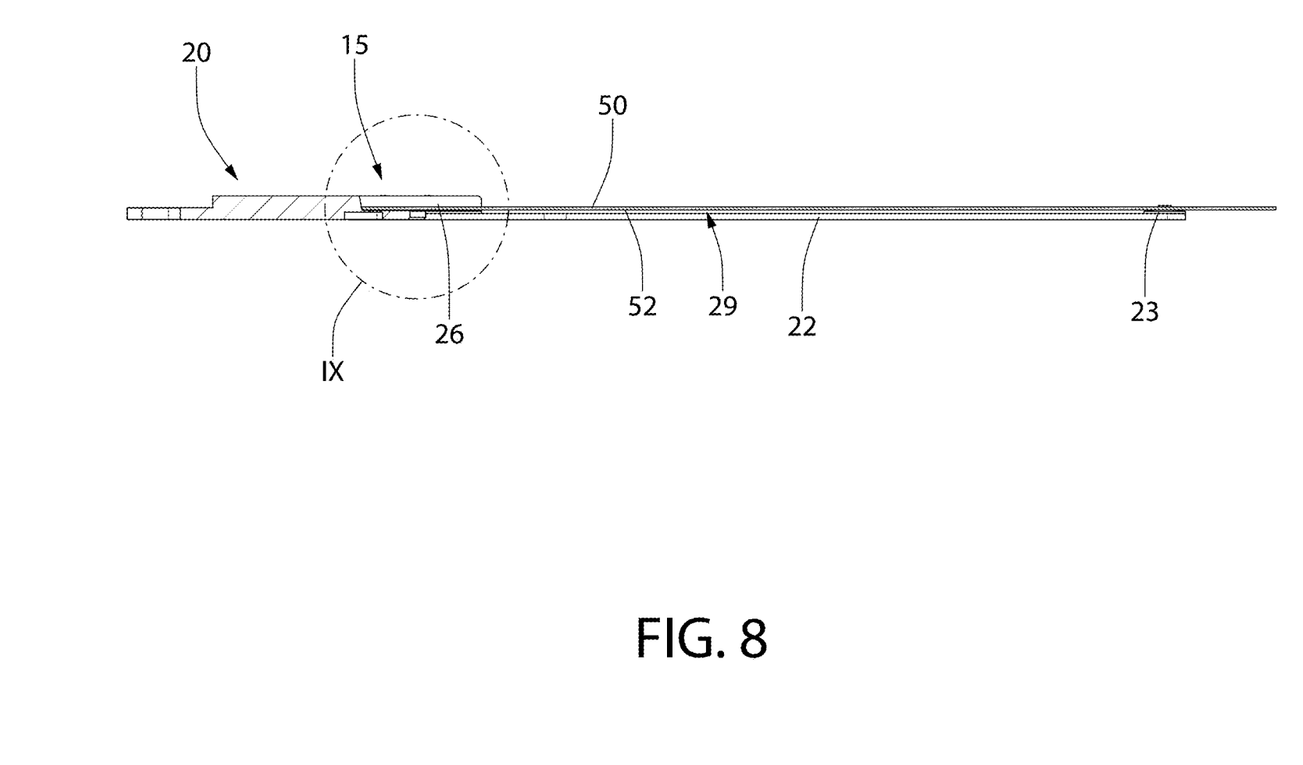
FIG. 8 is a cross-sectional view taken along line VIII-VIII of FIG. 4.
Figure 9:
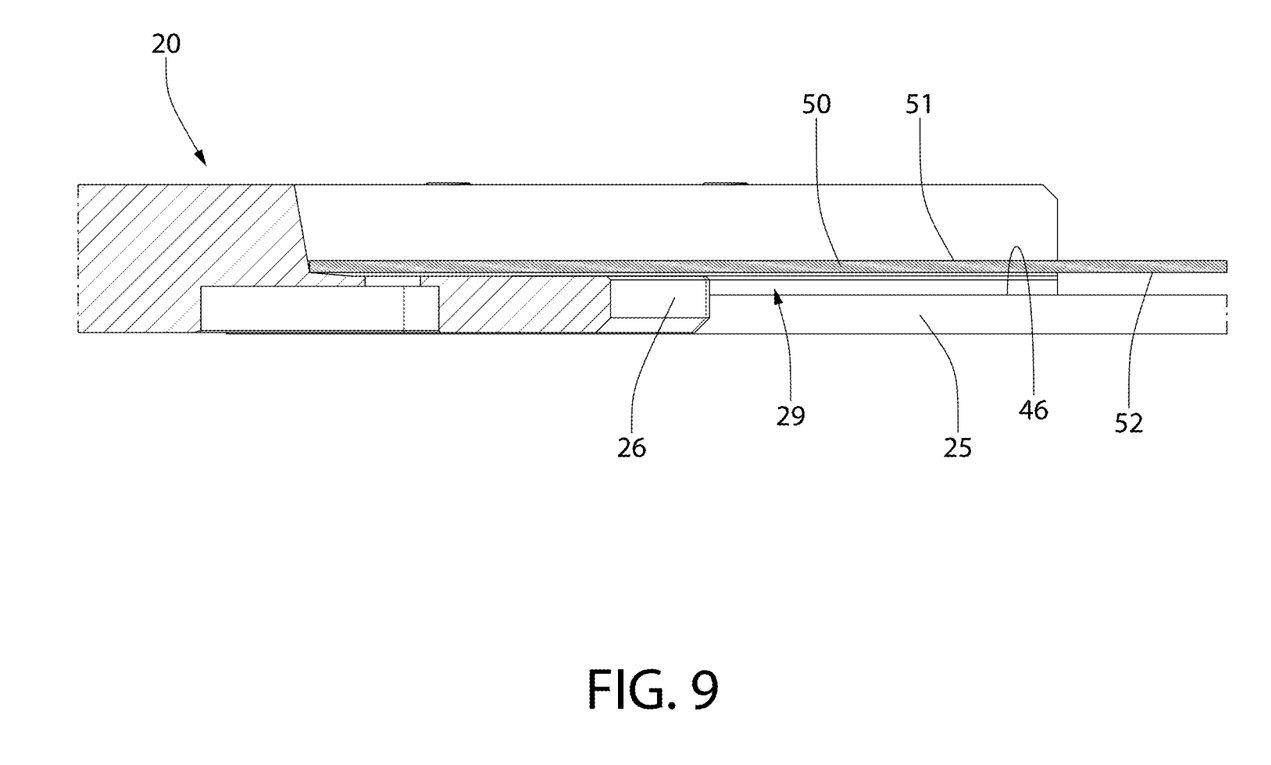
FIG. 9 is a close-up of area IX of FIG. 8.

Referring to FIGS. 8 and 9, a side elevation view is provided illustrating the wafer support structure 15 of the end effector 20 supporting the wafer 50. FIGS. 8 and 9 illustrate the full extent of the gap (i.e., air gap or suction gap) 29 between the bottom surface 52 of the wafer 50 and the top surface 46 of the ledge portion 25. As noted, the wafer 50 could be flipped so that the top surface 51 faces downwardly towards the ledge portion 25, in which case the gap 29 is between the top surface 51 of the wafer 50 and the top surface 46 of the ledge 25.

Figure 10:
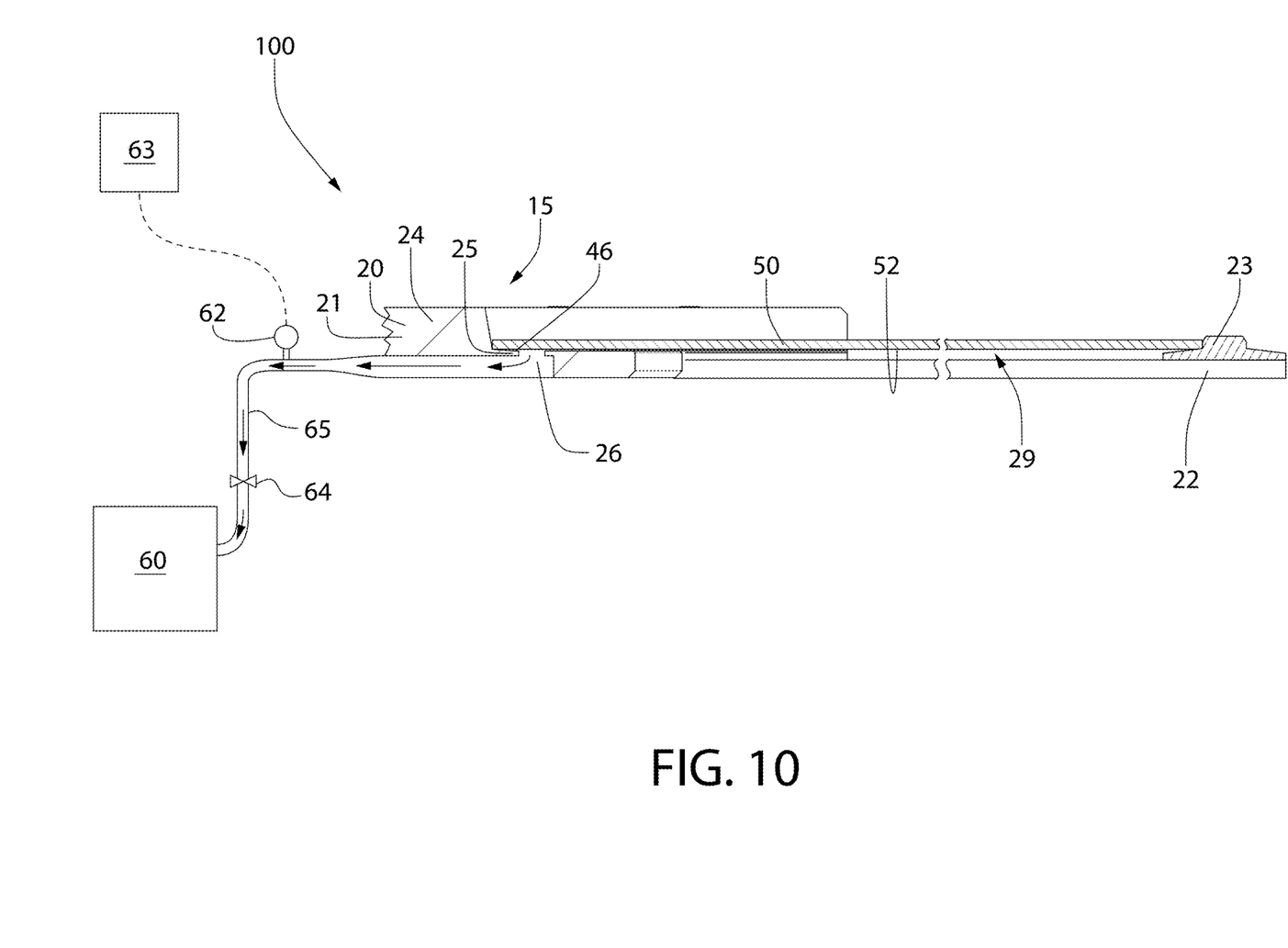
FIG. 10 is a schematic and not necessarily to scale illustration of a wafer detection system that comprises the end effector of FIG. 2.

FIG. 10 is a schematic illustration of a wafer detection system 100 which includes the end effector 20 and the wafer support structure 15 thereof, the wafer 50 supported by the wafer support structure 15, a pump 60, a valve 61, and a pressure sensor 62 for measuring the vacuum pressure. The pump 60 may be a high capacity vacuum pump. The valve 61 may be a solenoid valve. The pump 60 may be operably coupled to the hole 26 in the ledge portion 25 via a conduit 65. The conduit 65 may be formed by a flexible cable, tube, or the like. When activated, the pump 60 may pull or suction air through the hole or opening 26 in the ledge portion 25. When the wafer 50 is supported by the wafer support structure 15, the pump 60 may pull or suction air from the gap 29 between the one of the top surface 51 and the bottom surface 52 of the wafer 50 facing the ledge portion 25 and the top surface 46 of the ledge portion 25.

The pressure sensor 62 may sense, detect, and/or measure the pressure. The pressure sensor 62 may be an absolute pressure sensor. The pressure sensor 62 may be located as close as possible to the wafer 50 to reduce measurement delays and improve accuracy, although the exact location/ positioning of the pressure sensor 62 may be modified from that which is depicted in the drawings. Based on the change in pressure, the pressure sensor 62 (or a processor operably coupled thereto) may be capable of determining whether the wafer 50 is supported by the end effector 20, and if so, whether the wafer 50 is properly positioned on the end effector 20 (referred to as goodness of position). That is, the pressure sensor 62 is used to sense a differential in pressure and in doing so no contact is required between the wafer support structure 15 and the wafer 50.

The pressure sensor 62 may be configured to measure the pressure and to determine whether the measured pressure is within a target pressure range. In certain embodiments, if the wafer 50 is positioned too close to the hole 26 where the vacuum is being applied, the pressure detected by the pressure sensor 62 will be too high and will fall outside of the target pressure range. In certain embodiments, if the wafer 50 is positioned too far from the hole 26 or is not supported by the end effector 20 at all, then the pressure detected by the pressure sensor 62 will be too low and will fall outside of the target pressure range. In some embodiments, if the wafer 50 is located on the wafer support structure 15 but is not properly seated, the pressure measured by the pressure sensor 62 will be outside of the target pressure range. The pressure sensor 62 may have certain pressure limits set therein so that the pressure sensor 62 can confirm the presence of the wafer 50 on the end effector 20 and also confirm the proper positioning of the wafer 50 on the end effector 20 (confirmed by the measured pressure being within the target pressure range).

In some embodiments, when the wafer 50 is supported by the wafer support structure 15 in a proper position, the pressure measured by the pressure sensor 62 will fall within the target pressure range. When this happens, the robot 10 may be permitted to perform its task. The task may comprise moving the wafer 50 to a process chamber, a processing station, a buffer, a cassette, or to another location for continued processing, for storage, or the like. The pressure sensor 62 may comprise or be operably coupled to a controller 63. As such, when the pressure is measured to be within the target pressure range, the pressure sensor 62 may send data reflective of this to the controller 63, which may then permit the robot 10 to perform its task. In other embodiments, this may be achieved without a separate controller.

In some embodiments, when the wafer 50 is either not supported by the wafer support structure 15 at all, or when the wafer 50 is supported by the wafer support structure 15 in an improper position, the pressure measured by the pressure sensor 62 may be outside of the target pressure range. In some embodiments, when the measured pressure is outside of the target pressure range, the robot 10 may be prevented from performing a task. That is, when the pressure is outside of the target pressure range, a determination is made that the wafer 50 is not properly seated on the wafer support structure 15 or is not present on the wafer support structure 15 at all, and as such the robot 10 should not continue its task (i.e. should not transport the wafer 50 to its next location). In this situation, the robot 10 may be prevented from continuing its task.

In another embodiment, when the pressure is measured to be outside of the target pressure range, an indicator may be activated. The indicator may be a light, or a sound, or a vibration, or some other indication that is perceptible to humans. This will enable a human operator to intervene and take action to ensure that the wafer 50 is properly positioned on the wafer support structure 15 and prevent the robot 10 from performing its task until this is achieved. In some embodiments, when the pressure is measured to be outside of the target pressure range, the robot 10 may be prevented from performing the task and an indicator may be activated. Again, the pressure sensor 62 may be operably coupled to the controller 63 to achieve this action (either the stopping of the robot 10 from performing its task or the activation of the indicator). Alternatively, the pressure sensor 62 may be equipped with the necessary technology to perform these functions on its own, and the controller 63 may be omitted.

While the invention has been described with respect to specific examples including presently preferred modes of carrying out the invention, those skilled in the art will appreciate that there are numerous variations and permutations of the above described systems and techniques. It is to be understood that other embodiments may be utilized, and structural and functional modifications may be made without departing from the scope of the present invention. Thus, the spirit and scope of the invention should be construed broadly as set forth in the appended claims.

What is claimed is:

1. A wafer detection system comprising:
   a robot comprising at least one end effector, the at least one end effector comprising a wafer support structure configured to support a wafer thereon without directly contacting a front surface of the wafer or a rear surface of the wafer, the wafer support structure comprising a ledge portion that is configured to extend below the wafer so that one of the front and rear surfaces of the wafer faces the ledge portion with a gap maintained between a top surface of the ledge portion and the one of the front and rear surfaces of the wafer;
   a vacuum pump;
   a conduit fluidly coupling the vacuum pump to the gap so that when activated the vacuum pump pulls air from the gap;
   a pressure sensor located along the conduit and configured to measure a pressure and to determine whether the measured pressure is within a target pressure range;
   wherein when the wafer is supported by the wafer support structure in a proper position, the measured pressure is within the target pressure range and the robot is permitted to perform a task; and
   wherein when the wafer is not supported by the wafer support structure or is supported by the wafer support structure in an improper position, the measured pressure is outside of the target pressure range and at least one of: the robot is prevented from performing the task; or an indicator is activated.

2. The wafer detection system according to claim 1 wherein the front and rear surfaces of the wafer are planar, and wherein the wafer further comprises a peripheral surface extending between the front and rear surfaces, a top outer edge located at an intersection of the top surface and the peripheral surface, and a bottom outer edge located at an intersection of the bottom surface and the peripheral surface, and wherein the support structure is configured to support the wafer such that one of the top and bottom outer edges of the wafer is in contact with the support structure while no contact exists between the support structure and either of the front and rear surfaces of the wafer.

3. The wafer detection system according to claim 2 further comprising:
the wafer support structure comprising:
a main body portion having an inner surface;
a sloped wall extending from the inner surface of the main body portion to a distal end, an intersection of the sloped wall and the inner surface of the main body portion forming a support corner; and
the ledge portion extending from the distal end of the sloped wall; and
wherein the support structure is configured to support the wafer so that the one of the top and bottom outer edges of the wafer is in contact with the support corner.

4. The wafer detection system according to claim 3 further comprising:
the inner surface of the main body portion being angled outwardly away from the ledge portion so that the inner surface of the main body does not contact the peripheral surface of the wafer when the wafer is supported by the wafer support structure; and
the sloped wall being angled downwardly from the inner surface of the main body portion so that the sloped wall does not contact the one of the front and rear surfaces of the wafer when the wafer is supported by the wafer support structure.

5. The wafer detection system according to claim 4 further comprising:
the top surface of the ledge portion being horizontally oriented, the ledge portion comprising an opening through which the vacuum pump is fluidly coupled to the gap.

6. The wafer detection system according to claim 3 further comprising:
a first paddle and a second paddle extending from the distal end of the sloped wall, the ledge portion being located in between the first and second paddles.

7. The wafer detection system according to claim 6 further comprising:
the first paddle comprising a first paddle body having a first distal end portion and a first support pin located at the first distal end portion of the first paddle body;
the second paddle comprising a second paddle body having a second distal end portion and a second support pin located at the second distal end portion of the second paddle body; and
wherein the first and second support pins are configured to support the wafer without contacting either of the front and rear surfaces of the wafer, the first and second paddle bodies extending below the wafer without contacting the wafer.

8. The wafer detection system according to claim 1 wherein the measured pressure is an absolute pressure or a pressure differential.

9. The wafer detection system according to claim 1 wherein the conduit comprises a tube.

10. The wafer detection system according to claim 1 wherein a height of the gap measured between the top surface of the ledge portion and the one of the front and rear surfaces of the wafer is constant along an entirety of the top surface of the ledge portion.

11. The wafer detection system according to claim 1 further comprising:
the at least one end effector comprising a passageway that is fluidly coupled to the vacuum pump by the conduit, the passageway terminating at an opening in the top edge of the ledge portion for pumping the air from the gap with the vacuum pump.

12. The wafer detection system according to claim 1 further comprising a solenoid valve located along the conduit.

13. The wafer detection system according to claim 12 wherein the solenoid valve is located between the vacuum pump and the pressure sensor.

14. A wafer detection system comprising:
a robot comprising at least one end effector, the at least one end effector comprising a ledge portion having an opening;
a vacuum pump;
a conduit fluidly coupling the vacuum pump to the opening in the ledge portion;
a pressure sensor located along the conduit and configured to measure a pressure and to determine whether the measured pressure is within a target pressure range;
a wafer configured to be supported by the at least one end effector so that a first surface of the wafer faces the ledge portion and is spaced apart from the ledge portion by an air gap, the vacuum pump configured to suction air from the air gap;
wherein when the wafer is supported by the at least one end effector in a proper position, the measured pressure is within the target pressure range; and
wherein when the wafer is not supported by the at least one end effector or is supported by the at least one end effector in an improper position, the measured pressure is outside of the target pressure range.

15. The wafer detection system according to claim 14 wherein the ledge portion extends below the wafer without contacting the wafer.

16. The wafer detection system according to claim 14 wherein the wafer is configured to be supported by the at least one end effector with neither of the front and rear surfaces of the wafer being in contact with the at least one end effector.

17. The wafer detection system according to claim 14 further comprising:
when the measured pressure is within the target pressure range, the robot is permitted to perform a task; and
when the measured pressure is not within the target pressure range, at least one of: the robot is prevented from performing the task; or an indicator is activated.

18. A method of detecting a presence and proper positioning of a wafer on a wafer handling robot, the method comprising:
fluidly coupling a vacuum pump to an opening in a ledge portion of the wafer handling robot via a conduit and activating the vacuum pump to suction air through the opening in the ledge portion;

measuring a pressure at a position along the conduit with a pressure sensor;

upon the measured pressure being within a target pressure range:
- determining that the wafer is properly positioned on the wafer handling robot such that a surface of the wafer that is facing the ledge portion is spaced from the ledge portion by an air gap; and
- permitting the wafer handling robot to perform a task; and upon the measured pressure being outside of the target pressure range:
- determining that the wafer is not properly positioned on the wafer handling robot; and
- at least one of: preventing the wafer handling robot from performing the task; or activating an indicator.

19. The method according to claim 18 wherein when the wafer is properly positioned on the wafer handling robot, neither of a front surface nor a rear surface of the wafer is in contact with the wafer handling robot.

20. The method according to claim 18 wherein when the wafer is properly positioned on the wafer handling robot, the air is suctioned from the air gap between the surface of the wafer and the ledge portion and through the opening in the ledge portion to the conduit.

* * * * *